(12) United States Patent
Barrett, Jr. et al.

(10) Patent No.: US 6,275,540 B1
(45) Date of Patent: Aug. 14, 2001

(54) SELECTIVE CALL RECEIVER HAVING AN APPARATUS FOR MODIFYING AN ANALOG SIGNAL TO A DIGITAL SIGNAL AND METHOD THEREFOR

(75) Inventors: Raymond Louis Barrett, Jr., Ft. Lauderdale; James G. Mittel, Lake Worth; Barry W. Herold, Delray Beach, all of FL (US)

(73) Assignee: Motorola, Inc., Schaumburg, IL (US)

( * ) Notice: Subject to any disclaimer, the term of this patent is extended or adjusted under 35 U.S.C. 154(b) by 0 days.

(21) Appl. No.: 08/941,913

(22) Filed: Oct. 1, 1997

(51) Int. Cl.[7] .............................. H04L 27/06; H03M 3/00
(52) U.S. Cl. ........................................... 375/316; 341/143
(58) Field of Search .......................... 375/316; 341/144, 341/143, 118, 126, 155

(56) References Cited

U.S. PATENT DOCUMENTS

| | | | |
|---|---|---|---|
| 4,308,524 | * | 12/1981 | Harrison et al. ...................... 341/122 |
| 5,087,914 | * | 2/1992 | Sooch et al. .......................... 341/120 |
| 5,103,229 | * | 4/1992 | Ribner ................................... 341/143 |
| 5,392,042 | * | 2/1995 | Pellon ................................... 341/143 |
| 5,953,636 | * | 9/1999 | Keate et al. ........................... 455/3.2 |

OTHER PUBLICATIONS

Paul R. Gray And Robert G. Meyer, *Analysis And Design Of Analog Integrated Circuits*, Second Edition, pp. 593–599, New York, 1977.

Sangil Park, Ph.D., *Motorola Deigital Signal Processors, principles of Sigma–Delta Modulation for Analog–to–Digital Converters*, Motorola APR8/D Rev. 1, 1993.

James C. Candy and Gabor C. Temes, *Oversampling Methods for A/D and D/A Conversion*, Source unknown.

\* cited by examiner

*Primary Examiner*—Chi Pham
*Assistant Examiner*—Khai Tran
(74) *Attorney, Agent, or Firm*—Randi L. Dulaney

(57) ABSTRACT

A selective call receiver (500) includes a radio receiver (501) and a processor (508). The radio receiver includes an antenna (502), a combination circuit (204), a bandpass filter (208), mixers (212, 214), analog-to-digital converters (222, 224), digital mixers (234, 236), a second combination circuit (242), and a digital-to-analog converter (246). The combination circuit receives an analog signal from the antenna and combines the same with an analog feedback signal generated by the digital-to-analog converter. The bandpass filter filters the output of the combination circuit and supplies its output to the mixers which down-convert the signal to baseband signals. These signals are modified by the analog-to-digital converters to digital signals which are up-converted by the digital mixers. The outputs of the digital mixers are combined by the second combination circuit to a digital output that is modified by the digital-to-analog converter to the analog feedback signal.

15 Claims, 7 Drawing Sheets

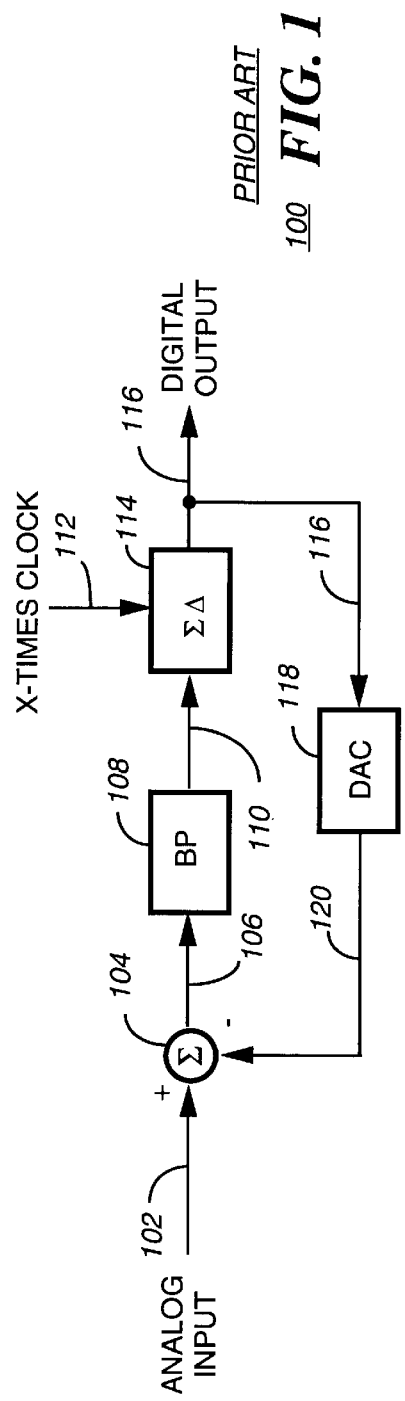
PRIOR ART FIG. 1
100
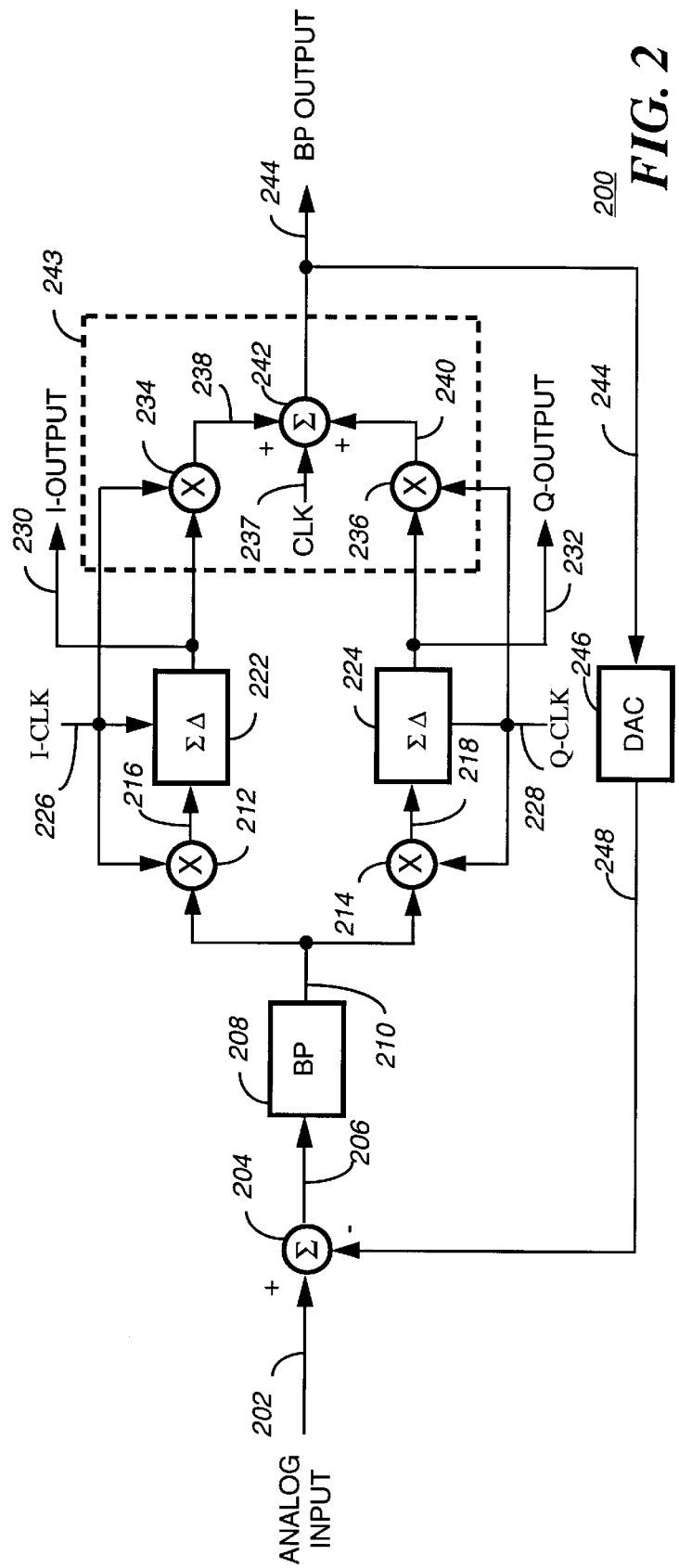
FIG. 2
200

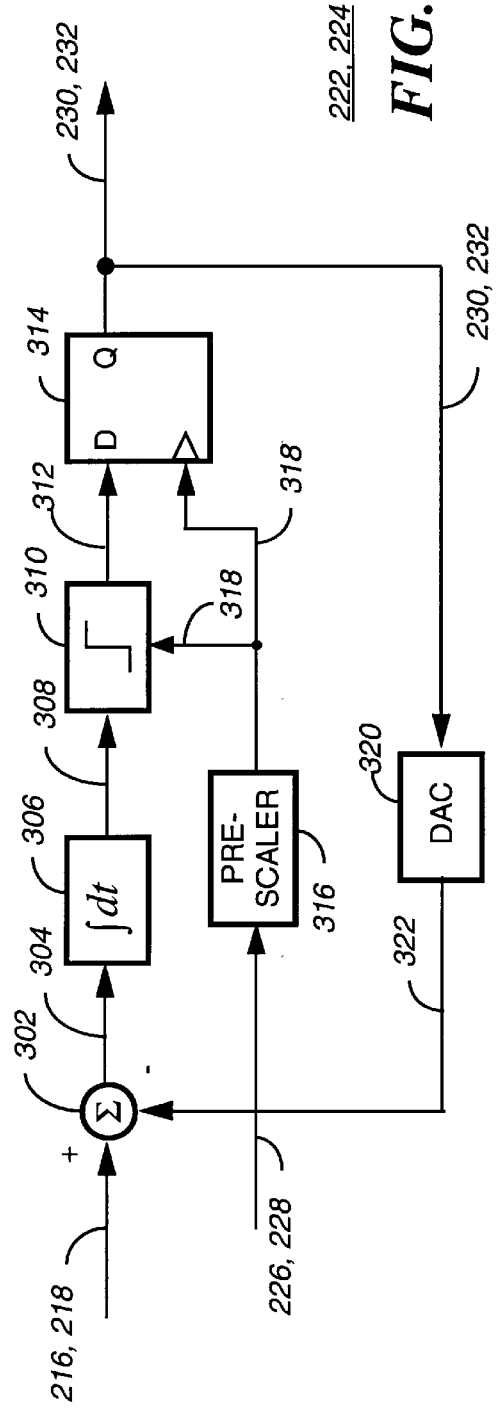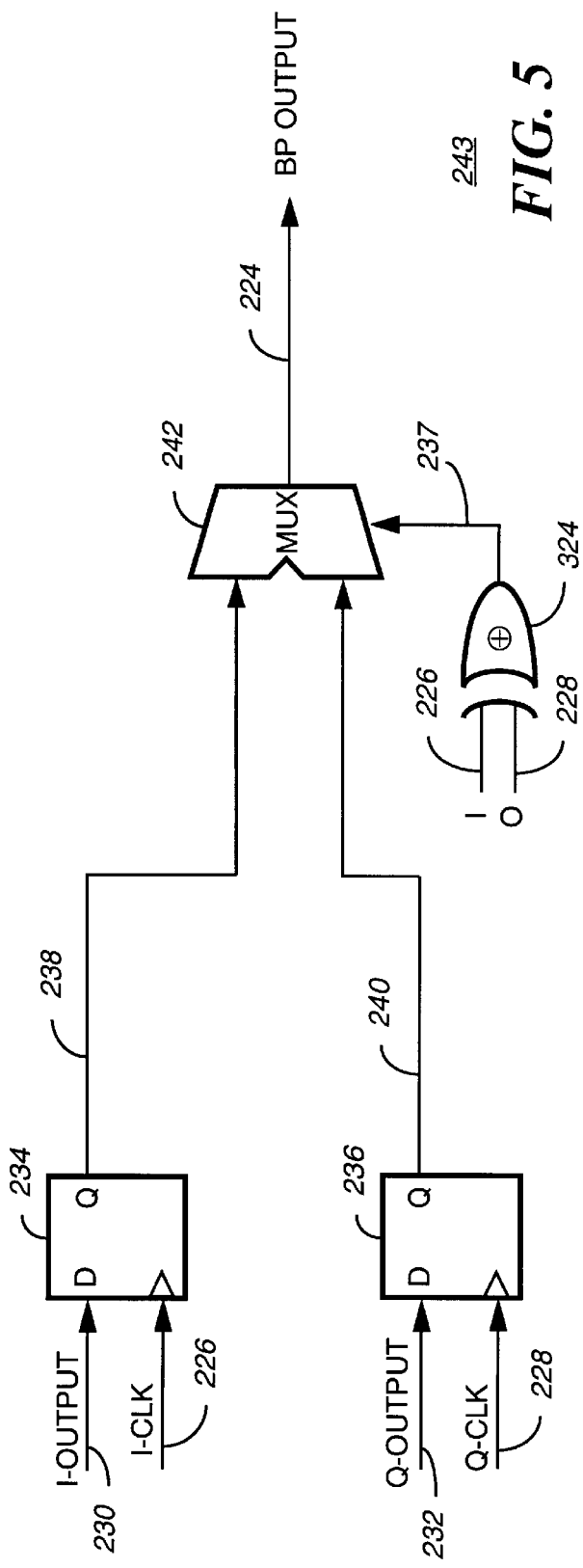
FIG. 4
FIG. 5

SELECTIVE CALL RECEIVER HAVING AN APPARATUS FOR MODIFYING AN ANALOG SIGNAL TO A DIGITAL SIGNAL AND METHOD THEREFOR

FIELD OF THE INVENTION

This invention relates in general to selective call receivers, and particularly to a selective call receiver having an apparatus for modifying an analog signal to a digital signal and method therefor.

BACKGROUND OF THE INVENTION

With the advent of new digital technologies, consumer products, such as battery operated selective call receivers, are utilizing high-speed analog-to-digital converters (ADC's) to replace a substantial portion of conventional radio demodulation circuits. This change in design is driven by advancements in the development of ADC's. One such advancement is the sigma-delta converter. Particularly, sigma-delta converters have been used because of their simplicity and their advantageous noise characteristics over other conventional ADC's such as successive approximation ADC's. A characteristic of sigma-delta converters, which makes them unique from other converters, is the technique of oversampling the input signal (by, e.g., five-times the Nyquist frequency). This oversampling technique, however, becomes disadvantageous when the input signal is not at a low frequency, e.g., baseband.

FIG. 1 shows an electrical block diagram of a prior art bandpass sigma-delta converter 100. The bandpass sigma-delta converter 100 comprises a difference circuit 104, a bandpass filter 108, a sigma-delta converter 114, and a digital-to-analog converter (DAC) 118. During normal operation, the difference circuit 104 combines an analog input signal 102 with an analog feedback signal 120 to produce an analog output signal 106. In this example, the analog input signal 102 operates at a given intermediate or carrier frequency (e.g., 200 MHz). The analog output signal 106 is then filtered by the bandpass filter 108 at the center frequency of the signal to produced a filtered analog signal 110. The filtered analog signal 110 is then converted by the sigma-delta converter 114 to a digital signal 116. Finally, the digital signal 116 is converted to the analog feedback signal 120 by the DAC 118.

Since the analog input signal 102 is not at baseband, and the sigma-delta converter 112 is operating from a clock source 112 at several times the Nyquist rate, several problems arise. For example, for a sigma-delta converter operating at a five-times oversampling frequency, an analog input signal 102 having a carrier frequency of 200 MHz is sampled at 1 GHz. This is undesirable in that the sigma-delta converter 114 must operate at a high clock rate, which results in a high measure of power dissipation. Additionally, the complexity of designing high-speed digital circuits at rates up to 1 GHz is substantial, and impractical for mass production.

Accordingly, a selective call receiver utilizing a method and apparatus that overcomes the foregoing disadvantages in the prior art is desirable.

BRIEF DESCRIPTION OF THE DRAWINGS

The present invention is pointed out with particularity in the appended claims. However, other features of the invention will become more apparent and best understood by referring to the following detailed description in conjunction with the accompanying drawings in which:

FIG. 1 shows an electrical block diagram of a prior art bandpass sigma-delta converter;

FIG. 2 shows an electrical block diagram of a bandpass analog-to-digital converter according to the present invention;

FIG. 4 shows an electrical block diagram of the sigma-delta converter of FIG. 2 according to the present invention;

FIGS. 5 and 6 show first and second embodiments of an electrical block diagram of the up-conversion circuit and multiplexer circuit of FIG. 2 according to the present invention;

FIG. 7 shows an electrical block diagram of the bandpass filter of FIG. 2 according to the present invention;

DESCRIPTION OF THE PREFERRED EMBODIMENT

Figure 3:
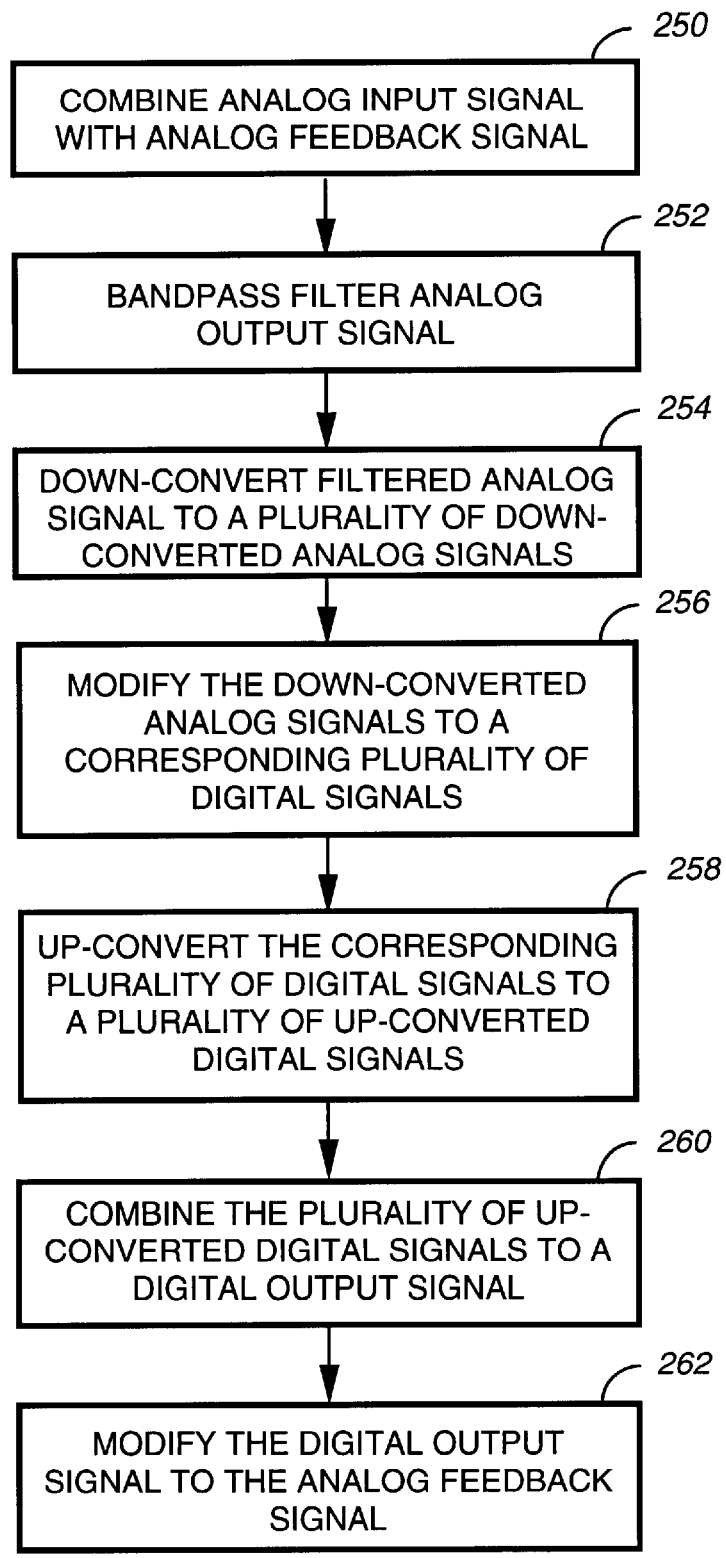
FIG. 3 shows a flow chart depicting the operation of the bandpass analog-to-digital converter of FIG. 2 according to the present invention.

FIG. 2 shows an electrical block diagram of a bandpass analog-to-digital converter (ADC) 200, and FIG. 3 shows a flow chart depicting the operational steps of the ADC 200 according to the present invention. The bandpass ADC 200 comprises a combination circuit 204, a bandpass filter 208, two mixers 212, 214, two sigma-delta converters 222, 224, two digital mixers 234, 236, a second combination circuit 242, and a digital-to-analog converter (DAC) 246.

Figures 6, 7:
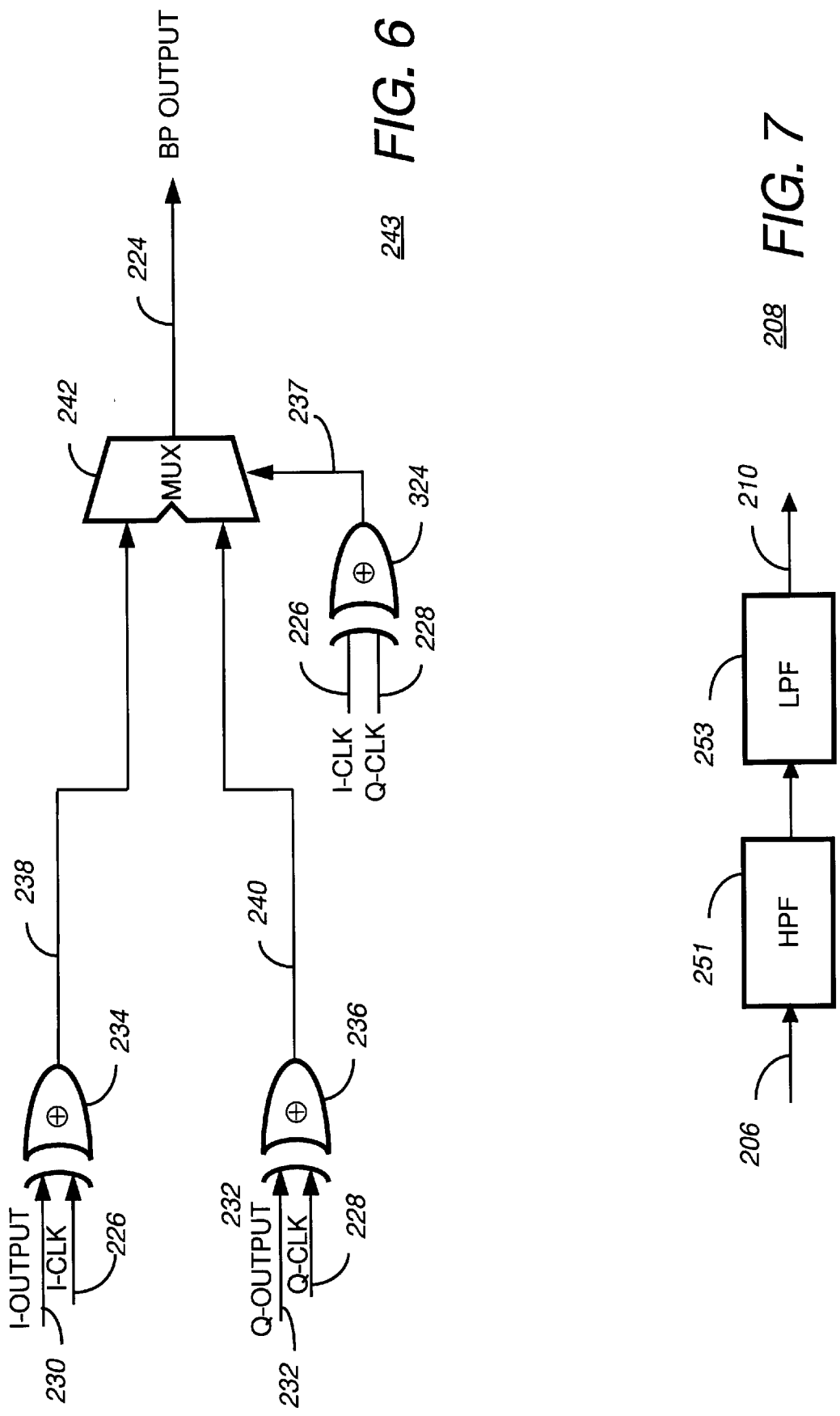

In step 250, an analog input signal 202 having a bandwidth and a carrier frequency greater than zero Hertz is combined with an analog feedback signal 248 for generating an analog output signal 206 operating at the carrier frequency. The analog output signal 206 is representative of the difference between the analog input signal 202 and the analog feedback signal 248. The analog output signal 206 is then filtered in step 252 with a conventional bandpass filter 208 centered about the carrier frequency having a passband substantially equal to the bandwidth of the analog input signal 202 for generating a filtered analog signal 210. The bandpass filter 208 is preferably implemented with the combination of a high-pass and low-pass filter 251, 253 (as shown in FIG. 7). It will be appreciated, however, that other bandpass filtering methods suitable to the present invention may be utilized.

In step 254, the filtered analog signal 210 is applied to a pair of mixers operating from two clock signals 226, 228 having a predetermined injection frequency substantially equal to the carrier frequency and offset from each other by a predetermined phase offset of 90 degrees. As a result of this operation, the pair of the mixers 212, 214 generate a corresponding set of down-converted analog signals 216, 218 operating at baseband.

Figure 8:
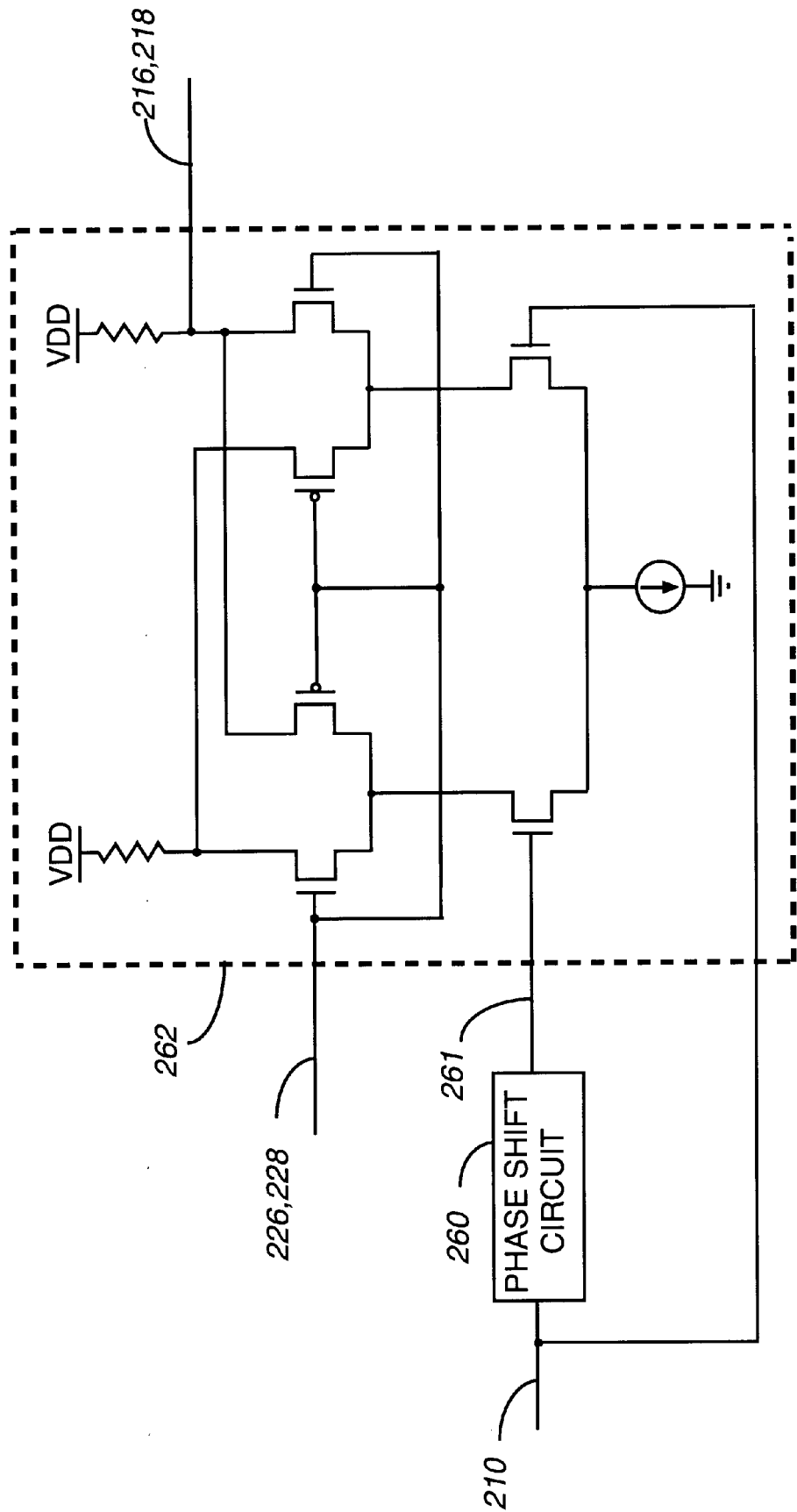
FIG. 8 shows an electrical block diagram of the mixer of FIG. 2 according to the present invention.

FIG. 8 shows an electrical block diagram of the mixers 212, 214 according to the present invention. Each mixer comprises a conventional phase shift circuit 260, and a conventional switching network 262 (shown here as a convention Gilbert cell, well-known in the art. A detailed description of a Gilbert cell is more fully described in Paul R. Gray And Robert G. Meyer, *Analysis And Design Of Analog Integrated Circuits*, Second Edition, pp. 593–599, New York, 1977, which is hereby incorporated herein by reference.). The phase shift circuit 260 generates a phase-shifted signal 261 representative of the filtered analog signal 210 having a phase offset of 180 degrees. The switching network 262 is coupled to the filtered analog signal 210 and the phase-shifted signal 261 for generating a selected one of the down-converted analog signals 216, 218. It will be appreciated that, alternatively, the mixers 212, 214 may comprise a plurality of phase shift circuits and switching networks utilizing a plurality of clock signals each offset from each other by a predetermined offset.

In step 256, by sigma-delta converters 222, 224 modify the down-converted analog signals 216, 218 to a corresponding set of digital signals 230, 232. The digital signals 230, 232 are baseband in-phase and quadrature digital representations of the down-converted analog signals 216, 218. Since the down-converted analog signals 216, 218 are at baseband, the sigma-delta converters 222, 224 operate at an oversampling frequency equal to several times the bandwidth of these signals, rather than at an oversampling frequency several times greater than the carrier frequency.

For example, suppose the filtered analog signal 210 has a carrier frequency of 200 MHz, and a bandwidth of 25 KHz. Further assume that it is desirable to operate the sigma-delta converters 222, 224 at an oversampling frequency equal to four-times the Nyquist frequency of the input signal. Since the down-converted analog signals 216, 218 are at baseband, the sigma-delta converters 222, 224 need only operate at 200 KHz (25 KHz*2 (Nyquist frequency) * 4 (oversampling frequency)). Had the sigma-delta converters 222, 224 operated directly on the filtered analog signal 210 (having a carrier frequency of 200 MHz), the sigma-delta converters 222, 224 would have had to operate at an oversampling frequency of 1.6 GHz (200 MHz*2 (Nyquist frequency)*4 (oversampling frequency)). With the present state of digital technology, operating digital circuits at 1.6 GHz results in a substantially high degree of energy dissipation, which is impractical.

However, operating at a sampling frequency of 200 KHz lends itself for easy implementation of the sigma-delta converters 222, 224 with conventional digital circuits, which at that frequency would dissipate a nominal amount of energy making them ideally suitable for battery operated consumer products. This is a substantial advantage over prior art bandpass ADC's that not only dissipate a substantial amount of energy, but that at high carrier frequencies are generally impractical to implement.

FIG. 4 illustrates an electrical block diagram of the sigma-delta converters 222, 224 of FIG. 2 according to the present invention. Each sigma-delta converter comprises a conventional combination circuit 302, an integrator 306, a digitizer circuit 310, a memory cell 314, a DAC 320 and a prescaler 316. The combination circuit 302 receives a selected one of the down-converted analog signals 216, 218 and a second analog feedback signal 322 and generates a difference signal 304. The difference signal 304 is then integrated conventionally by the integrator 306 to generate an integrated output signal 308, which is digitized by the digitizer circuit 310 to produced a digitized output signal 312. The digitizer circuit 310 is preferably a delta modulation circuit which quantizes the change in the difference signal 304 from sample to sample rather than the absolute value of the difference signal 304 at each sample. The digitized output signal 312 is then stored in the memory cell 314 (such as, e.g., a D Flip Flop) to produce a selected one of the corresponding digital signals 230, 232.

The digitizer circuit 310 and the memory cell 314 are operated from a digital clock signal 318 generated conventionally by the prescaler 316, which is coupled to a selected one of the clock signals 226, 228. Since the sigma-delta converters 222, 224 operate on a baseband signal, the prescaler 316 can be set to a divide-by-N value that corresponds to generating a clock signal 318 operating at an oversampling frequency equal to a multiple of the highest frequency of the baseband signal (e.g., five-times the highest frequency). The digital signal 230, 232 generated by the memory cell 314 is then converted by the DAC 320 to the analog feedback signal 322, which is representative of a selected one of the down-converted analog signals 216, 218.

Although the discussions above have focused on the use of sigma-delta converters, it will be appreciated that, alternatively, other analog-to-digital converters suitable to the present invention may be utilized.

Referring back to FIGS. 2 and 3, in step 258, the digital signals 230, 232 generated by the sigma-delta converters 222, 224 are up-converted by digital mixers 234, 236, thereby generating up-converted digital signals 238, 240. Similar, to the mixers 212, 214, the digital mixers 234, 236 are coupled to digital clock signals 226, 228 operating at the same injection frequency (i.e., the carrier frequency of the filtered analog signal 210) and offset from each other by 90 degrees. In the present example, the digital clock signals 226, 228 are the same as the clock signals 226, 228. It will be appreciated, however, that alternatively the clock signals 226, 228 used by the mixers 212, 214 may be characteristically different from the digital clock signals 226, 228 used by the digital mixers 234, 236 (e.g., sine wave versus square wave signals, respectively). In any case, however, each of the respective clock signals would operate at the same carrier frequency and would have the same phase offset arrangement. The up-converted digital signals 238, 240 are, in step 260, combined by the second combination circuit 242, which operates from a clock source 237 have a frequency equal to twice the injection frequency. The combination of the up-converted digital signals 238, 240 results in a digital output signal 244 operating at the carrier frequency.

FIGS. 5 and 6 show first and second embodiments of an electrical block diagram of the digital mixers 234, 236 and the second combination circuit 242 according to the present invention. As shown in FIG. 5, a first embodiment of the digital mixers 234, 236 comprises the use of memory cells 234, 236. These memory cells 234, 234 preferably comprise D Flip-Flops coupled to the digital clock signals 226, 228 operating at the carrier frequency. The up-converted digital signals 238, 240 generated by the memory cells 234, 236 are combined to the digital output signal 224 using a convention multiplexer circuit 242 coupled to the clock source 237. The clock source 237 is preferably derived from the combination of the digital clocks signals 226, 228 using a conventional exclusive OR gate 324. The second embodiment shown in FIG. 6 is substantially similar to that shown in FIG. 5 with the exception that the memory cells 234, 236 are replaced alternatively by exclusive OR gates 234, 236 coupled to the digital signals 230, 232 and their respective digital clock signals 226, 228.

Figure 9:
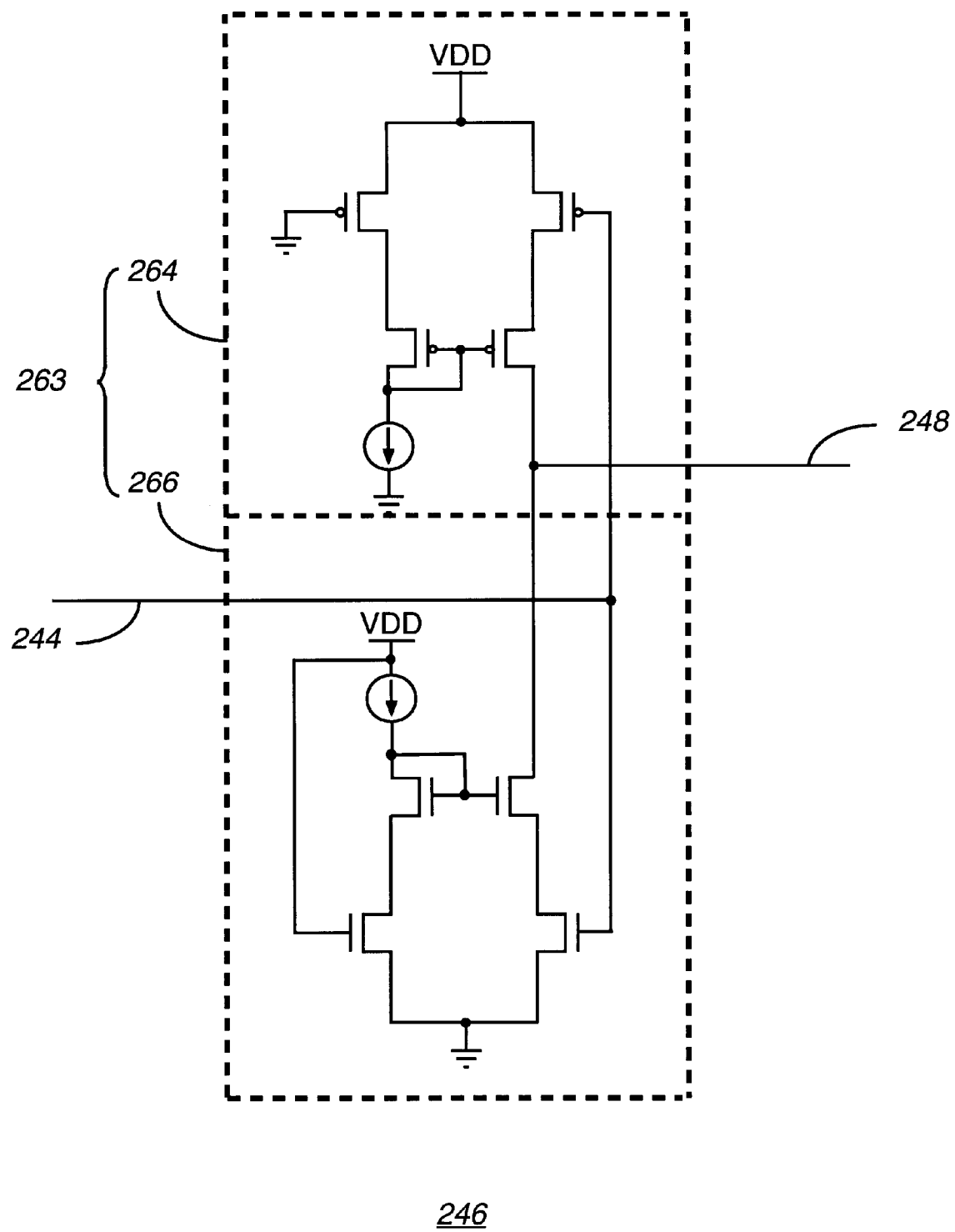
FIG. 9 shows an electrical block diagram of the digital-to-analog converter of FIG. 2 according to the present invention.

Finally, in step 262, the digital output signal 244 is modified by the DAC 246 to generate the analog feedback signal 248 which is substantially representative of the analog input signal 202. The DAC 246 is preferably a current source 263 (as shown in FIG. 9) comprising conventional pull-up and pull-down circuits 264, 266. The pull-up circuit 264 is used for sourcing current when the digital output signal 244 is at a first logic level (e.g., active-high logic level), while the pull-down circuit 266 is used for sinking current when the digital output signal 244 is at a logic level opposite to the first logic level (e.g., active-low logic level). The resulting signal output is the analog feedback signal 248. It will be appreciated that other conventional DAC's suitable to the present invention may be used.

It will be further appreciated that the two-phase bandpass ADC 200 just described above may be implemented with additional phases. In such a case, each phase would comprise a mixer coupled to a corresponding sigma-delta converter (or other comparable analog-to-digital converter) and a digital mixer. Each of the mixers would be coupled to a clock signal operating, for example, at the carrier frequency. Moreover, each clock signal would be offset by a predetermined phase offset. For example, in a three phase system the predetermine phase offset of each clock signal would be 60 degrees. Finally, the digital signals generated by the multiplicity of digital mixers would be combined respectively to a single digital output signal using a multiplexer circuit that combines each phased output signal.

Figure 10:
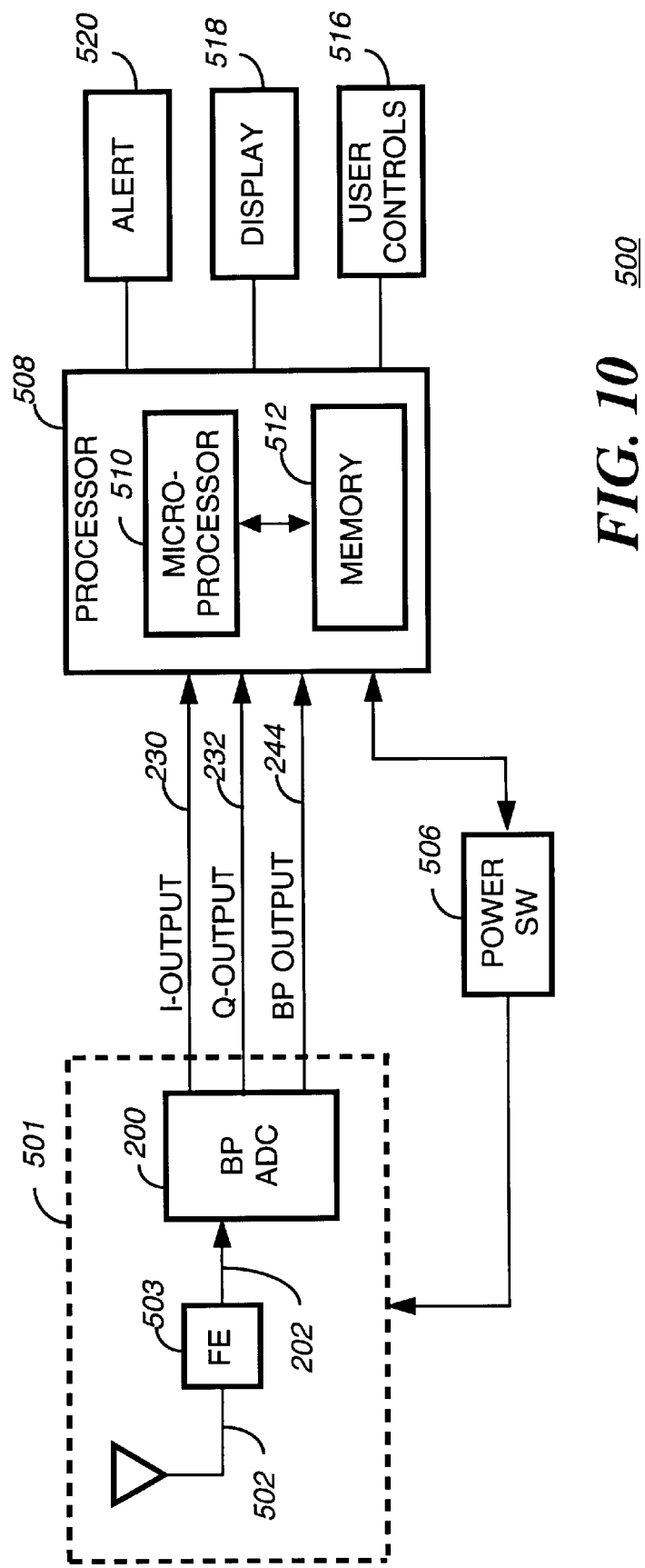
FIG. 10 shows an electrical block diagram of a selective call receiver utilizing the bandpass analog-to-digital converter of FIG. 2 according to the present invention.

FIG. 10 shows an electrical block diagram of a SCR (selective call receiver) 500 utilizing the bandpass ADC 200 of FIG. 2 according to the present invention. The SCR 500 comprises a radio receiver 501 comprising an antenna 502 coupled to a conventional front-end circuit 503 and the bandpass ADC 200 for intercepting RF signals from, for example, a radio communication system (not shown). A conventional power switch 506, coupled to a processor 508, is used to control the supply of power to the radio receiver 501, thereby providing a battery saving function.

The front-end circuit 503 comprises, for example, a conventional amplifier and a preselector filter for producing the analog input signal 202. Radio signals received by the radio receiver 501 produce any one of two embodiments of demodulated information. In a first embodiment the demodulated information is represented by the baseband digital signals 230, 232, whereas in a second embodiment the demodulated information is represented by the bandpass digital output signal 244. In either embodiment, these signals are coupled to a processor 508 for processing messages included therein. In the case where the processor 508 receives the bandpass digital output signal 244, the processor 508 is programmed to filter the bandpass digital output signal 244 prior to demodulating the signal to baseband.

To perform the necessary functions of the SCR 500, the processor 508 includes a DSP (digital signal processor) 510, and a memory 512 including, for example, a random access memory (RAM), a read-only memory (ROM), and an electrically erasable programmable read-only memory (EEPROM). It will be appreciated that the memory 512, singly or in combination, can be manufactured as an integral portion of the DSP 510. It will be further appreciated that, alternatively, substantial portions of the ADC 200 may be implemented as an integral part of the processor 508. For example, the sigma-delta converters 222, 224, the mixers 234, 236, and second combination circuit 242 may be an integrated into the processor 508. Additionally, it will be appreciated that, alternatively, such portions of the ADC 200 may be implemented as part of the software processing steps of the processor 508.

The processor 508 is programmed by way of the memory 512 to process incoming messages transmitted by the radio communication system. The processor 508 decodes an address in the demodulated data included in the signals generated by the bandpass ADC 200, compares the decoded address with one or more addresses stored in the memory 512, and when a match is detected, proceeds to process the remaining portion of the message. Once the processor 508 has processed the message, it stores the message in the memory 512, and a call alerting signal is generated to alert a user that a message has been received. The call alerting signal is directed to a conventional audible or tactile alerting device 520 for generating an audible or tactile call alerting signal.

The message can be accessed by the user through user controls 516, which provide functions such as lock, unlock, delete, read, etc. More specifically, by the use of appropriate functions provided by the user controls 516, the message is recovered from the memory 512, and conveyed to the user by way of, for example, a conventional display 518. It will be appreciated that additionally an audio circuit (not shown) may also be used for conveying voice messages.

It should be apparent to the reader that the bandpass ADC 200 provides substantial advantages over the prior art. In particular, the bandpass ADC 200 eliminates a substantial portion of conventional demodulation circuits used by radio receivers. In addition, the low power consumption of the bandpass ADC 200 makes it ideally suitable for consumer products such as selective call receivers. Lastly, because the sigma-delta converters 222, 224 operate at a low frequency, a substantial portion of the bandpass ADC 200 can be employed with conventional digital circuits that are easily portable over many fabrication processes.

Although the invention has been described in terms of a preferred embodiment it will be obvious to those skilled in the art that many alterations and variations may be made without departing from the invention. Accordingly, it is intended that all such alterations and variations be considered as within the spirit and scope of the invention as defined by the appended claims.

What is claimed is:

1. A method, comprising:

combining an analog input signal having a bandwidth and a carrier frequency with an analog feedback signal, thereby generating an analog output signal operating at the carrier frequency;

bandpass filtering the analog output signal, thereby generating a filtered analog signal;

down-converting the filtered analog signal according to a plurality of clock signals offset from each other by a predetermined phase offset and operating at a predetermined injection frequency, thereby generating a plurality of down-converted analog signals;

combining a selected one of the plurality of down-converted analog signals with a second analog feedback signal, thereby generating a second analog output signal;

integrating the second analog output signal, thereby generating an integrated output signal;

digitizing the integrated output signal, thereby generating a digitized signal;

storing the digitized signal at a rate equal to a submultiple of the predetermined injection frequency, thereby generating a selected one of a corresponding plurality of digital signals;

modifying the selected one of the corresponding plurality of digital signals to the second analog feedback signal;

up-converting the corresponding plurality of digital signals according to a plurality of digital clock signals offset from each other by the predetermined phase offset and operating at the predetermined injection frequency, thereby generating a plurality of up-converted digital signals;

combining the plurality of up-converted digital signals, thereby generating a digital output signal operating at the carrier frequency; and modifying the digital output signal to the analog feedback signal.

2. An apparatus, comprising:

a combination circuit coupled to an analog input signal having a bandwidth and a carrier frequency and coupled to an analog feedback signal for generating an analog output signal operating at the carrier frequency;

a bandpass filter coupled to the analog output signal for generating a filtered analog signal;

a plurality of mixers coupled to the filtered analog signal for generating a plurality of down-converted analog signals,
wherein the plurality of mixers are coupled to a plurality of clock signals operating at a predetermined injection frequency, and
wherein the plurality of clock signals are offset from each other by a predetermined phase offset;

a plurality of analog-to-digital converters coupled to the plurality of down-converted analog signals for generating a corresponding plurality of digital signals;

a plurality of digital mixers coupled to the corresponding plurality of digital signals for generating a plurality of up-converted digital signals,
wherein the plurality of digital mixers are coupled to a corresponding plurality of digital clock signals operating at the predetermined injection frequency, and
wherein the corresponding plurality of digital clock signals are offset from each other by the predetermined phase offset;

a second combination circuit coupled to the plurality of up-converted digital signals for generating a digital output signal operating at the carrier frequency; and a digital-to-analog converter coupled to the digital output signal for generating the analog feedback signal.

3. The apparatus as recited in claim 2, wherein the bandpass filter comprises:

a high-pass filter; and a low-pass filter.

4. The apparatus as recited in claim 2, wherein the plurality of analog-to-digital converters comprise a corresponding plurality of sigma-delta converters.

5. The apparatus as recited in claim 4, wherein the plurality of sigma-delta converters are coupled to a corresponding plurality of second digital clock signals operating at a submultiple of the predetermined injection frequency, and offset from each other by the predetermined phase offset.

6. The apparatus as recited in claim 5, wherein each of the plurality of sigma-delta converters comprises:

a third combination circuit coupled to a selected one of the plurality of down-converted analog signals and a second analog feedback signal for generating a second analog output signal;

an integrator coupled to the second analog output signal for generating an integrated output signal;

a digitizer circuit coupled to the integrated output signal for generating a digitized signal;

a memory cell coupled to a selected one of the corresponding plurality of second digital clock signals and to the digitized signal for generating a selected one of the corresponding plurality of digital signals; and a second digital-to-analog converter coupled to the selected one of the corresponding plurality of digital signals for generating the second analog feedback signal.

7. The apparatus as recited in claim 2, wherein the second combination circuit comprises a multiplexer circuit.

8. The apparatus as recited in claim 2, wherein the digital-to-analog converter comprises a current source including:

a pull-up circuit for sourcing current when the digital output signal is at a first logic level; and a pull-down circuit for sinking current when the digital output signal is at a logic level opposite to the first logic level.

9. The apparatus as recited in claim 2, wherein the plurality of digital mixers comprises a corresponding plurality of exclusive OR gates.

10. The apparatus as recited in claim 2, wherein the plurality of digital mixers comprises a corresponding plurality of memory cells.

11. The apparatus as recited in claim 2, wherein each of the plurality of mixers comprise:

at least one phase shift circuit coupled to the filtered analog signal for generating at least one phase-shifted signal; and at least one switching network coupled to the at least one phase-shifted signal and the filtered analog signal for generating a selected one of the plurality of down-converted analog signals.

12. An apparatus, comprising:

a combination circuit coupled to an analog input signal having a bandwidth and a carrier frequency and coupled to an analog feedback signal for generating an analog output signal operating at the carrier frequency;

a bandpass filter coupled to the analog output signal for generating a filtered analog signal;

a plurality of mixers coupled to the filtered analog signal for generating a plurality of down-converted analog signals, wherein the plurality of mixers are coupled to a plurality of clock signals operating at a predetermined injection frequency, wherein the plurality of clock signals are offset from each other by a predetermined phase offset, and wherein each of the plurality of mixers comprises
a phase shift circuit coupled to the filtered analog signal for generating a phase-shifted signal, and
a switching network coupled to the phase-shifted signal for generating a selected one of the plurality of down-converted analog signals;

a plurality of sigma-delta converters coupled to the plurality of down-converted analog signals and coupled to a corresponding plurality of second digital clock signals operating at a submultiple of the predetermined injection frequency, and offset from each other by the predetermined phase offset for generating a corresponding plurality of digital signals;

a plurality of memory cells coupled to the corresponding plurality of digital signals for generating a plurality of up-converted digital signals,
wherein the plurality of memory cells are coupled to a corresponding plurality of digital clock signals operating at the predetermined injection frequency, and
wherein the corresponding plurality of digital clock signals are offset from each other by the predetermined phase offset;

a multiplexer circuit coupled to the plurality of up-converted digital signals for generating a digital output signal operating at the carrier frequency; and a digital-to-analog converter coupled to the digital output signal for generating the analog feedback signal.

13. A selective call receiver comprising the apparatus of claim 2.

14. A selective call receiver, comprising:

a radio receiver, comprising
- an antenna for generating an analog signal;
- a combination circuit coupled to the analog signal having a bandwidth and a carrier frequency and coupled to an analog feedback signal for generating an analog output signal operating at the carrier frequency;
- a bandpass filter coupled to the analog output signal for generating a filtered analog signal;
- a plurality of mixers coupled to the filtered analog signal for generating a plurality of down-converted analog signals,
  - wherein the plurality of mixers are coupled to a plurality of clock signals operating at a predetermined injection frequency, and
  - wherein the plurality of clock signals are offset from each other by a predetermined phase offset;
- a plurality of analog-to-digital converters coupled to the plurality of down-converted analog signals for generating a corresponding plurality of digital signals;
- a plurality of digital mixers coupled to the corresponding plurality of digital signals for generating a plurality of up-converted digital signals,
  - wherein the plurality of digital mixers are coupled to a corresponding plurality of digital clock signals operating at the predetermined injection frequency, and
  - wherein the corresponding plurality of digital clock signals are offset from each other by the predetermined phase offset;
- a second combination circuit coupled to the plurality of up-converted digital signals for generating a digital output signal operating at the carrier frequency; and
- a digital-to-analog converter coupled to the digital output signal for generating the analog feedback signal;

a plurality of low pass filters coupled to the corresponding plurality of digital signals for generating a corresponding plurality of filtered digital signals; and a processor coupled to the radio receiver, the processor adapted to:
- cause the radio receiver to receive a radio message; and
- process the radio message from the corresponding plurality of filtered digital signals generated by the radio receiver.

15. A selective call receiver, comprising:

a radio receiver, comprising
- an antenna for generating an analog signal;
- a combination circuit coupled to the analog signal having a bandwidth and a carrier frequency and coupled to an analog feedback signal for generating an analog output signal operating at the carrier frequency;
- a bandpass filter coupled to the analog output signal for generating a filtered analog signal;
- a plurality of mixers coupled to the filtered analog signal for generating a plurality of down-converted analog signals,
  - wherein the plurality of mixers are coupled to a plurality of clock signals operating at a predetermined injection frequency, and
  - wherein the plurality of clock signals are offset from each other by a predetermined phase offset;
- a plurality of analog-to-digital converters coupled to the plurality of down-converted analog signals for generating a corresponding plurality of digital signals;
- a plurality of digital mixers coupled to the corresponding plurality of digital signals for generating a plurality of up-converted digital signals,
  - wherein the plurality of digital mixers are coupled to a corresponding plurality of digital clock signals operating at the predetermined injection frequency, and
  - wherein the corresponding plurality of digital clock signals are offset from each other by the predetermined phase offset;
- a second combination circuit coupled to the plurality of upconverted digital signals for generating a digital output signal operating at the carrier frequency; and
- a digital-to-analog converter coupled to the digital output signal for generating the analog feedback signal;
- a second bandpass filter coupled to the digital output signal for generating a filtered digital signal; and a processor coupled to the radio receiver, the processor adapted to:
- cause the radio receiver to receive a radio message; and
- process the radio message from the filtered digital signal generated by the radio receiver.

* * * * *